United States Patent
Feldtkeller

(12) 
(10) Patent No.: US 6,650,094 B2
(45) Date of Patent: Nov. 18, 2003

(54) CIRCUIT CONFIGURATION FOR SUPPLYING AN ELECTRICAL CONSUMER AND FOR LIMITING A TIME DEVIATION OF A SWITCHING CURRENT OF A CONSUMER

(75) Inventor: Martin Feldtkeller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/753,588

(22) Filed: Jan. 3, 2001

(65) Prior Publication Data

US 2001/0035743 A1 Nov. 1, 2001

Related U.S. Application Data

(63) Continuation of application No. PCT/DE99/02010, filed on Jul. 1, 1999.

(30) Foreign Application Priority Data

Jul. 3, 1998 (DE) .......................... 198 29 837

(51) Int. Cl.$^7$ .............................................. G05F 1/613
(52) U.S. Cl. ....................... 323/225; 323/271; 323/282; 323/299
(58) Field of Search ................................ 323/223, 224, 323/225, 268, 271, 282, 289, 299, 351

(56) References Cited

U.S. PATENT DOCUMENTS

| | | | | |
|---|---|---|---|---|
| 4,366,432 A | * | 12/1982 | Noro | 323/224 |
| 4,449,174 A | * | 5/1984 | Ziesse | 323/222 |
| 4,473,790 A | | 9/1984 | Plunkett et al. | 318/798 |
| 4,658,203 A | * | 4/1987 | Freymuth | 323/282 |
| 4,725,768 A | * | 2/1988 | Watanabe | 323/351 |
| 4,890,021 A | * | 12/1989 | Walker | |
| 5,164,892 A | * | 11/1992 | Kimbara | 323/224 |
| 5,180,964 A | * | 1/1993 | Ewing | 323/223 |
| 5,287,046 A | | 2/1994 | Carpenter et al. | 318/293 |
| 5,396,165 A | * | 3/1995 | Hwang et al. | 323/299 |
| 5,729,153 A | | 3/1998 | Afek et al. | 326/27 |
| 5,982,160 A | * | 11/1999 | Walters et al. | 323/282 |
| 6,069,471 A | * | 5/2000 | Nguyen | 323/271 |
| 6,304,472 B1 | * | 10/2001 | Nagasu et al. | 323/282 |

FOREIGN PATENT DOCUMENTS

| | | | | |
|---|---|---|---|---|
| DE | 43 03 905 A1 | 8/1994 | | H03K/17/16 |
| DE | 43 30 996 A1 | 3/1995 | | H03K/17/16 |

* cited by examiner

*Primary Examiner*—Jeffrey Sterret
(74) *Attorney, Agent, or Firm*—Laurence A. Greenberg; Werner H. Stemer; Ralph E. Locher

(57) ABSTRACT

A circuit configuration for supplying switchable voltage and/or current to an electrical consumer, includes a switching device, a voltage source for tapping high and low supply potentials, a driver circuit for the switching device, a lead between the voltage source and the switching device, a leakage inductance distributed to the lead, a measuring and evaluating circuit for detecting voltage deviations at input terminals of the driver circuit arising from current deviations in the leakage inductance of the lead and for evaluating the current deviations, and a feedback circuit for controlling feedback of the driver circuit to slow switching processes of the switching device whenever a value of a voltage change at the input terminals of the switching device exceeds a defined threshold value. A method for limiting a time deviation of a switching current of a consumer is also provided.

14 Claims, 2 Drawing Sheets

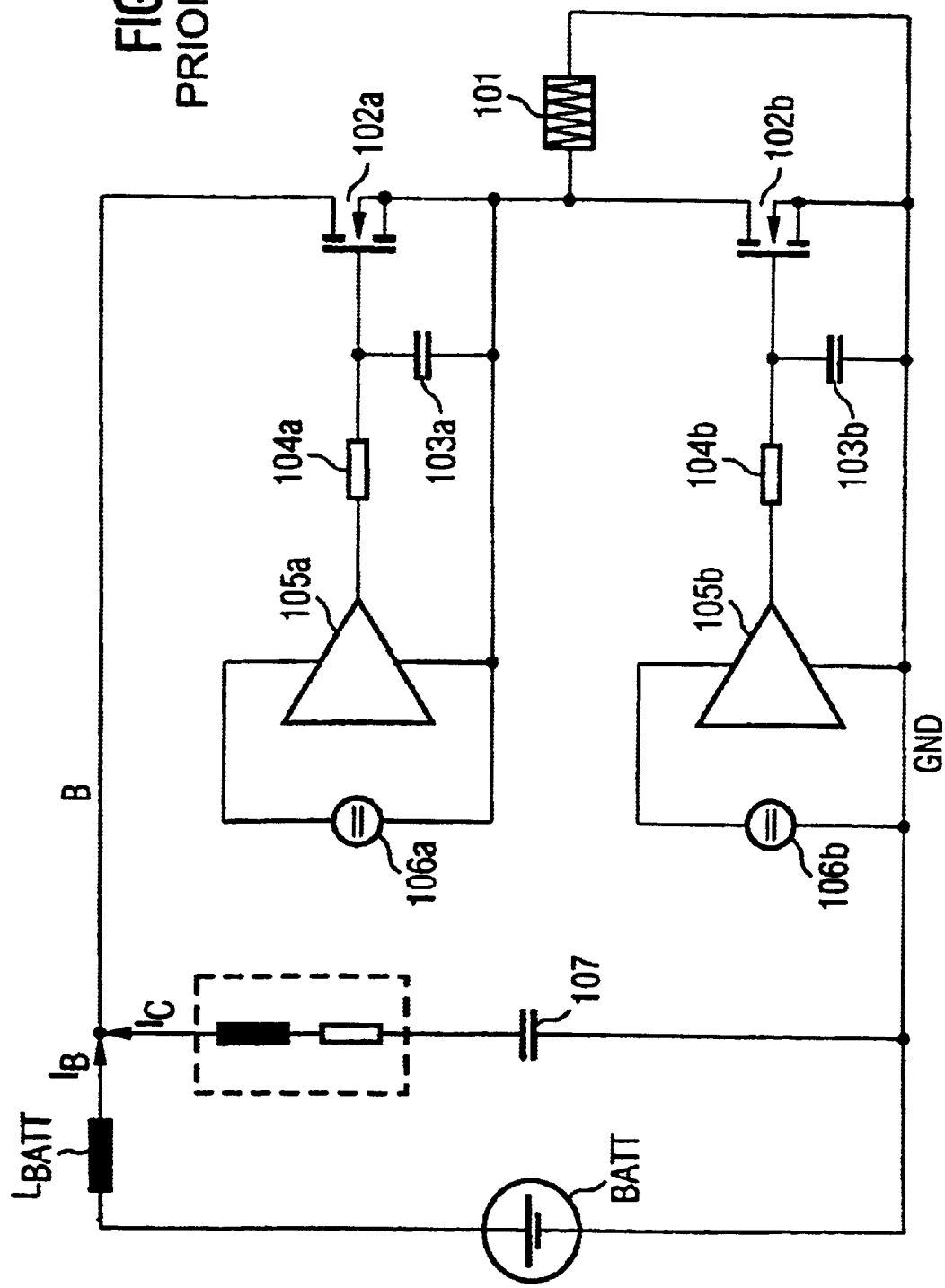

CIRCUIT CONFIGURATION FOR SUPPLYING AN ELECTRICAL CONSUMER AND FOR LIMITING A TIME DEVIATION OF A SWITCHING CURRENT OF A CONSUMER

CROSS-REFERENCE TO RELATED APPLICATION

This application is a continuation of copending International Application No. PCT/DE99/02010, filed Jul. 1, 1999, which designated the United States.

BACKGROUND OF THE INVENTION

Field of the Invention

The invention relates to a circuit configuration for switching an electrical consumer, particularly an inductive consumer. Specifically, the invention relates to a control device for switching high-power electric motors, namely multiphase drives such as rotary or three-phase current motors, for instance for use in automotive assembly. The invention also relates to a method for limiting a time deviation of a switching current of a consumer.

Such drives are cycled at a high frequency of, for instance, 20 kHz given currents of 100 amperes or more and given a conventional supply voltage of 12 or 14 volts. Under those conditions, switching losses dominate total losses of high-power semiconductor switch elements of the control device. Those switching losses depend on the period of the switching process. For that reason, a switching process must progress as quickly as possible. On one hand, the steepness of the voltage edge dU/dt of the switching edges should be and may be relatively high, because capacitive radiation of leads to control electronics for the electrical consumer plays a subordinate role. On the other hand, stray or leakage inductances affect the switching processes, so that an optimally precise limiting of the rate of rise and fall dI/dt of the switching current is indispensable.

German Published, Non-Prosecuted Patent Application DE 43 30 996 A1 discloses a control device for an electrical consumer, particularly an inductive consumer, in which capacitors are connected in parallel between the gate terminal and the source terminal of power MOS transistors in order to be able to set the time deviation dI/dt of the current and the time deviation dU/dt of the voltage substantially independently of one another. That type of control device is schematically represented in the circuit diagram of FIG. 2 and described in detail below. One problem with such a known control device is that a time period until a minimum switch-on resistance is attained is also substantially prolonged and significantly larger drive powers are required. Therefore, the known device is preferably used for load currents under 10 Amperes.

Another problem is that circuit configurations containing capacitors which are connected parallel to gate-source portions of power transistors tend to oscillate.

SUMMARY OF THE INVENTION

It is accordingly an object of the invention to provide a circuit configuration for controlling a switching device for switching an electrical consumer and a method for limiting a time deviation of a switching current of a consumer, which overcome the hereinafore-mentioned disadvantages of the heretofore-known devices and methods of this general type and in which switching losses can be minimized and a time deviation of a switching current dI/dt can be set at a maximum value. The device should also be usable for very large currents on the order of 100 Amperes or more, and should have a simple structure.

With the foregoing and other objects in view there is provided, in accordance with the invention, a circuit configuration for supplying switchable voltage and/or current to an electrical consumer, comprising a switching device having input terminals. A voltage source has at least two output terminals for tapping at least one high and one low supply potential. A driver circuit is connected to the input terminals of the switching device for driving the switching device. At least one lead is connected between the output terminals of the voltage source and the input terminals of the switching device. At least one leakage inductance is distributed to the at least one lead. A measuring and evaluating circuit detects voltage deviations at the input terminals of the driver circuit arising from current deviations in the at least one leakage inductance of the at least one lead and evaluates the current deviations. A feedback circuit controls feedback of the driver circuit to slow switching processes of the switching device whenever an absolute value of a voltage change at the input terminals of the switching device exceeds a defined threshold value.

With the objects of the invention in view, there is also provided a method for limiting a time deviation dI/dt of a switching current of an electrical consumer with such a circuit configuration. The method comprises the following steps: detecting a value of an induction voltage brought about by current deviations dI/dt at the lead between the high supply potential and the switching device; and regulating at least one of the voltage and current supply of the electrical consumer in dependence upon the detected induction voltage for limiting the time-related current deviation dI/dt to a defined maximum value.

Rapid switching processes cause voltage peaks at all inductances in series with the power switches. They are detected by the detector, and the switching current deviation is readjusted accordingly. The circuit thus automatically adapts to its environment, for instance to assembly-related stray or leakage inductances. In addition, the edge steepness dU/dt of the supply voltage of the consumer is not affected. Furthermore, the control circuit according to the invention requires fewer external switch elements than the above-mentioned known control device.

In accordance with another feature of the invention, the switching device includes two field effect transistors that are connected into a half-bridge, the gate contacts of which are each connected to the output of a driver circuit. The feedback circuit preferably controls these driver circuits in such a way that a voltage with a small absolute value which is detected by the detection device brings about a large gate current of the field effect transistors and thus a large deviation in the switching current dI/dt. A voltage with a large absolute value that is detected by the detection device gives rise to a small gate current of the field effect transistors and thus a small deviation in switching current dI/dt. The current control through the driver circuits thus does not affect the edge steepness dU/dt of the voltages at the field effect transistors.

In accordance with a further feature of the invention, the circuit configuration includes a blocking capacitor that is connected parallel to the voltage source of the consumer.

In accordance with an added feature of the invention, the detection device includes a series circuit of a capacitor with an ohmic resistor. That circuit is connected parallel to this voltage source. The capacitor is thus connected to the high supply potential with one terminal. In order to provide an optimal functioning of the circuit, the capacitive time constant $C_F \cdot R_F$ of the detection device approximately corresponds to the inductive time constant $L_E/R_E$ of the blocking capacitor leads.

In accordance with an additional feature of the invention, the detection device detects the amplitude of voltage peaks that arise at the leads of the blocking capacitor or at the supply terminals of the voltage source as the controlled quantity, and feed it to the feedback circuit as the controlled quantity. The circuit thus adapts to its environment automatically, particularly to the series inductance of the blocking capacitor.

In accordance with yet another feature of the invention, there are provided a common detection device and a common feedback circuit for several driver circuits and field effect transistors, since transistors that switch simultaneously are also jointly responsible for a voltage peak, and non-switching transistors are not affected by the intervention of the feedback circuit.

In accordance with a concomitant feature of the invention, the maximum time-related switching current deviation dI/dt can be adjusted to a value that is still tolerable.

Other features which are considered as characteristic for the invention are set forth in the appended claims.

Although the invention is illustrated and described herein as embodied in a circuit configuration for controlling a switching device for switching an electrical consumer and a method for limiting a time deviation of a switching current of a consumer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a circuit diagram of a known configuration for switching an electrical consumer.

DESCRIPTION OF THE PREFERRED EMBODIMENTS

Figure 1:
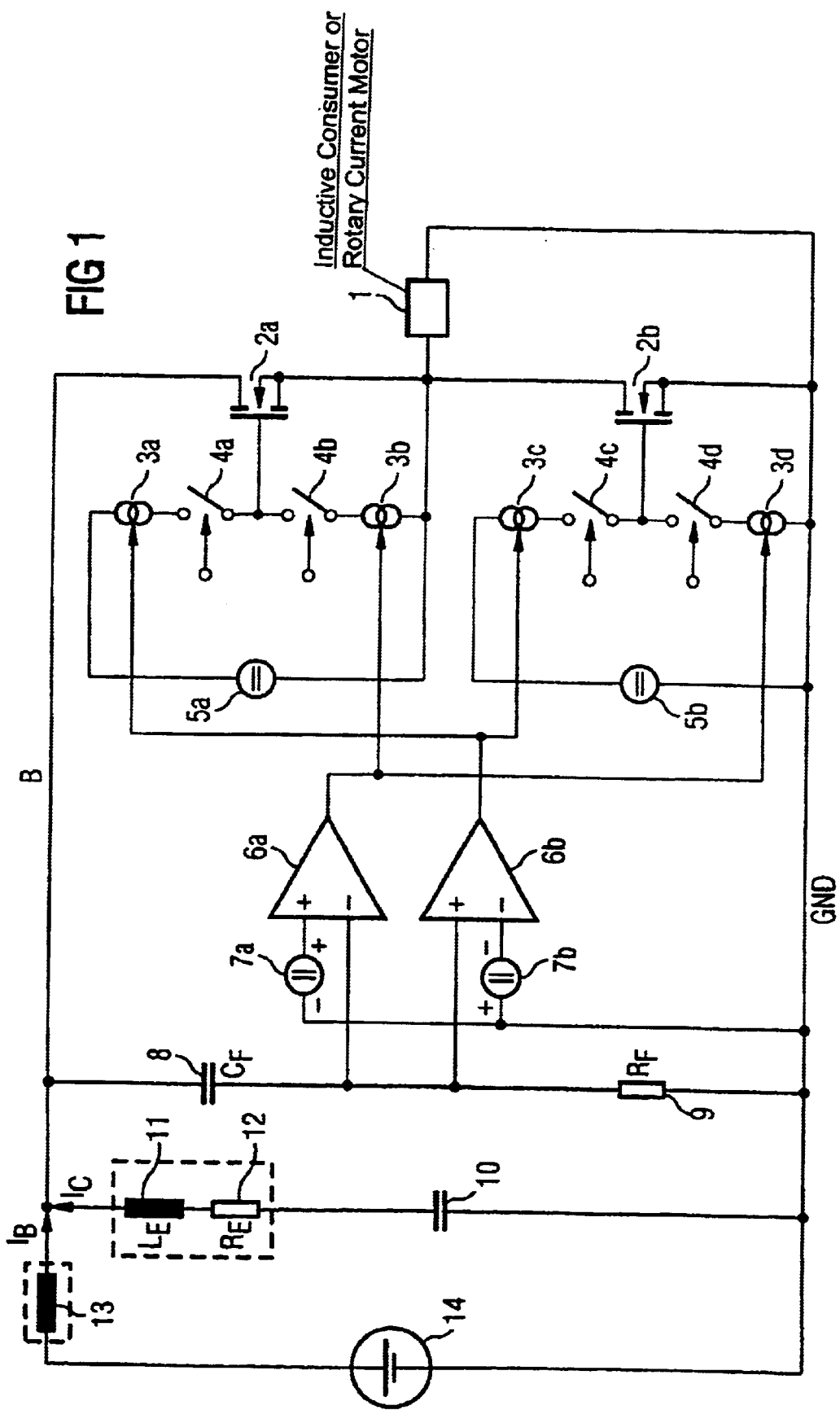
FIG. 1 is a schematic circuit diagram of an embodiment example of a configuration according to the invention.

Referring now to the figures of the drawings in detail and first, particularly, to FIG. 2 thereof, there is seen a known control device for an electrical consumer, particularly an inductive consumer, in which capacitors are connected in parallel between a gate terminal and a source terminal of a power MOS transistor in order to be able to set a time deviation dI/dt of a current and a time deviation dU/dt of a voltage substantially independently of one another. More specifically, a consumer 101 is controlled by field effect transistors 102a, 102b having gate terminals which are connected through respective resistors 104a, 104b to respective driver circuits 105a, 105b. The field effect transistors 102a, 102b are connected in serial and form a half-bridge, having a center tap to which the consumer 101 is connected. Capacitors 103a, 103b are each connected between a gate contact and a source contact of a respective one of the transistors 102a, 102b. The driver circuits 105a, 105b are connected to respective voltage sources 106a, 106b. A battery BATT has outputs connected to ground GND and a terminal voltage B. A lead from the battery BATT to a drain terminal of the FET 102a has a lead inductance $L_{BATT}$ with a middle d.c. portion $I_B$. A blocking capacitor 107 connected between ground GND and the terminal voltage B has an equivalent resistance and an ohmic equivalent resistance shown in a block outlined in broken lines.

As mentioned above, a problem with such a known control device is that the time until a minimum switch-on resistance is attained is likewise substantially prolonged, and that significantly larger drive powers are required. Therefore, the known device is preferably used for load currents under 10 Amperes. Another problem is that circuit configurations containing capacitors which are connected parallel to gate-source portions of power transistors tend to oscillate.

FIG. 1 shows a preferred embodiment example of a circuit configuration according to the invention for switching an electrical consumer. A voltage source 14, such as a vehicle battery, delivers a d.c. voltage of, for instance, 14 Volts. Reference numeral 13 indicates a lead inductance of a lead from the current source 14 to power switch elements 2a, 2b. The latter are preferably constructed as power MOS transistors. A terminal voltage B is present at a drain contact of the switch element 2a and ground GND is present at a source terminal of the switch element 2b. The switch elements 2a, 2b together form a half-bridge, which is connected in a known manner to an inductive consumer 1, for example, a rotary current motor. The power transistors 2a, 2b are controlled through driver circuits which are connected to gate terminals of the switch elements 2a, 2b. The driver circuits are formed of voltage sources 5a, 5b, respective controlled current sources 3a, 3b and 3c, 3d and respective switch elements 4a, 4b and 4c, 4d, which are in turn controlled by appropriate control signals.

Rapid switching processes cause voltage peaks at all inductances in series with the power switch. The lead inductance 13 from the voltage source 14 to the power switch elements 2a, 2b is approximately 5 μH. Only a middle d.c. portion $I_B$ of the supply current can flow over it. Alternating-current portions must be intercepted by blocking capacitors. The embodiment example represented in FIG. 1 is provided with a blocking capacitor 10 which, including the lead, has an equivalent inductance $L_E$ 11 and an ohmic equivalent resistance $R_E$ 12 conditional to its construction. The inductance $L_E$ is on the order of 5 nH to 50 nH, as a consequence of which voltage peaks can continue to arise at the supply terminals in switching processes. In order to ensure that they do not grow arbitrarily high, it is necessary to limit the time-related current deviation dI/dt. The blocking capacitor can also be omitted when the lead between the voltage source 14 and the switching device is short. In this case, the voltage source takes on the function of the blocking capacitor.

A detection circuit including a capacitor 8 having a capacitance $C_F$ and an ohmic resistance $R_F$ 9, which are connected in series between supply terminals of the voltage source, detects voltage peaks that are induced by switching processes through an a.c. coupling to the supply voltage B by the capacitor 8. A voltage change at the parasitic series inductance 11 of the blocking capacitor 10 or at the equivalent series resistance 12 thus also leads to a voltage change at the output of the detection circuit, which is delivered to a feedback circuit 6a, 6b, 7a, 7b as a control quantity. The provision of the resistance $R_F$ makes it possible to feed the absolute value of the voltage change that is brought about by induction to the feedback circuit 6a, 6b, 7a, 7b. The feedback circuit is formed by first and second difference amplifiers 6a and 6b, having outputs which are respectively connected to the controlled current sources 3a, 3b and 3c, 3d of the driver circuit for the power transistors 2a, 2b. A non-inverting input of the first difference amplifier 6a is connected to a positive terminal of a voltage source 7a and an inverting input of the second difference amplifier 6b is connected to a negative terminal of a voltage source 7b. An inverting terminal of the first difference amplifier 6a and a non-inverting terminal of the second difference amplifier 6b are connected to the output of the detection circuit, i.e. to a connection point of the capacitor 8 and the resistor 9.

The mode of functioning of the control device according to the invention that is represented in FIG. 1 will now be described.

The detection device 8, 9 detects induction voltages that arise at the inductance 13 or the inductance 11 through the capacitive coupling by way of the capacitor 8, which are brought about by rapid current changes of the switching current. The detection device 8, 9 thus directly detects noise quantities that must be limited, namely undesirable voltage peaks which are generated by the switching process. The circuit thus automatically adapts to its environment, particularly to the series inductance of the blocking capacitor 10 or to assembly-related stray or leakage inductances. The controlled quantity that is detected in this way is fed through the feedback circuit 6a, 6b, 7a, 7b to the drivers 3, 4, 5, which control the power transistors 2a, 2b in such a way that a voltage with a small absolute value which is detected by the detection device gives rise to a large gate current of the field effect transistors and thus a large source/drain current deviation dI/dt. Conversely, a voltage with a large absolute value that is detected by the detection device gives rise to a small gate current and thus a small deviation of the drain-source current dI/dt at the power transistors. Thus, if excessively high inductive voltage peaks are detected, the current supply to the gates of the power transistors is throttled, thereby reducing the steepness of the current of the power transistors independent of the voltage steepness.

In order to provide an optimal functioning of the circuit according to the invention, a capacitive time constant $T_F=C_F \cdot R_F$ Of the detection device 8, 9 should be approximately equal to an inductive time constant $T_E=L_E/R_E$ of the blocking capacitor 10.

If the control device according to the invention is used for a multi-phase half-bridge drive, one detection device and one feedback circuit suffice for all half-bridges together, as long as they have a common blocking capacitor or use several blocking capacitors jointly.

The circuit configuration according to the invention for switching an electrical consumer and the method according to the invention for limiting the time deviation of the current of a consumer thus make it possible to provide a low-loss, high-frequency power control of a consumer such as a rotary current motor. The current deviations dI/dt which occur and the induction voltage peaks they cause can be limited to a defined maximum value.

I claim:

1. A circuit configuration for supplying at least one of switchable voltage and current to an electrical consumer, comprising:
    a switching device having input terminals;
    a voltage source having at least two output terminals for tapping at least one high and one low supply potential;
    a driver circuit connected to said input terminals of said switching device for driving said switching device;
    at least one lead connected between said output terminals of said voltage source and said input terminals of said switching device;
    at least one leakage inductance distributed to said at least one lead;
    a measuring and evaluating circuit for detecting voltage deviations at said input terminals of said driver circuit arising from current deviations in said at least one leakage inductance of said at least one lead, and for evaluating said current deviations; and
    a feedback circuit for controlling feedback of said driver circuit to slow switching processes of said switching device by reducing time deviations of the switching current whenever a value of a voltage change measured by the measuring and evaluating circuit exceeds a defined threshold value.

2. The circuit configuration according to claim 1, including another driver circuit, said switching device having two field effect transistors in the form of a half-bridge with gate contacts each connected to an output of a respective one of said driver circuits.

3. The circuit configuration according to claim 2, wherein said low supply potential is a reference potential, one of said field effect transistors has a drain terminal connected to said high supply potential, and another of said field effect transistors has a source terminal connected to said reference potential.

4. The circuit configuration according to claim 2, wherein said feedback circuit controls said driver circuits causing a voltage with a small value detected by said measuring and evaluating circuit to give rise to a large gate current of said field effect transistors and thus a large switching current deviation dI/dt, and conversely causing a voltage with a large value to give rise to a small gate current of said field effect transistors and thus a small switching current deviation dI/dt.

5. The circuit configuration according to claim 2, wherein said feedback circuit and said measuring and evaluating circuit are a common circuit for said driver circuits and said field effect transistors.

6. The circuit configuration according to claim 1, wherein said measuring and evaluating circuit is connected parallel to said voltage source and includes a series circuit of a capacitor and an ohmic resistor.

7. The circuit configuration according to claim 6, including a blocking capacitor connected parallel to said voltage source and having an inductive time constant $T_E=L_E/R_E$, a lead connected to said blocking capacitor, and said measuring and evaluating circuit having a capacitive time constant $T_F=C_F \cdot R_F$ approximately equal to said inductive time constant $T_E=L_E/R_E$ of said blocking capacitor, where:
    $C_F$=a capacity of said capacitor of said measuring and evaluating circuit;
    $R_F$=a resistance of said ohmic resistor of said measuring and evaluating circuit;
    $L_E$=an inductance of said blocking capacitor including said at least one lead; and
    $R_E$=an ohmic resistance of said blocking capacitor including said at least one lead connected to said blocking capacitor.

8. The circuit configuration according to claim 6, wherein said capacitor is connected to said high supply potential.

9. The circuit configuration according to claim 1, wherein said measuring and evaluating circuit detects an amplitude of voltage peaks arising at supply terminals of said voltage source and delivers it to said feedback circuit as a controlled quantity.

10. The circuit configuration according to claim 1, including a blocking capacitor connected parallel to said voltage source.

11. The circuit configuration according to claim 1, wherein the consumer has an adjustable maximum time-related current deviation dI/dt.

12. The circuit configuration according to claim 1, wherein the consumer is an inductive consumer to be switched.

13. The circuit configuration according to claim 1, wherein the consumer is a rotary current motor to be switched.

14. A method for limiting a time deviation dI/dt of a switching current of an electrical consumer with a circuit configuration for supplying at least one of switchable voltage and current to an electrical consumer, comprising:

a switching device having input terminals;

a voltage source having at least two output terminals for tapping at least one high and one low supply potential;

a driver circuit connected to said input terminals of said switching device for driving said switching device;

at least one lead connected between said output terminals of said voltage source and said input terminals of said switching device;

at least one leakage inductance distributed to said at least one lead;

a measuring and evaluating circuit for detecting voltage deviations at said input terminals of said driver circuit arising from current deviations in said at least one leakage inductance of said at least one lead, and for evaluating said current deviations; and a feedback circuit for controlling feedback of said driver circuit to slow switching processes of said switching device whenever a value of a voltage change at said input terminals of said switching device exceeds a defined threshold value;

and which comprises the following steps:

detecting a value of an induction voltage brought about by current deviations dI/dt at said lead between said high supply potential and said switching device; and regulating at least one of the voltage and current supply of the electrical consumer in dependence upon the detected induction voltage for limiting the time-related current deviation dT/dt to a defined maximum value.

\* \* \* \* \*